United States Patent [19]

Zupancic

[11] Patent Number: 4,908,096
[45] Date of Patent: Mar. 13, 1990

[54] PHOTODEFINABLE INTERLEVEL DIELECTRICS

[75] Inventor: Joseph J. Zupancic, Bensenville, Ill.

[73] Assignee: Allied-Signal Inc., Morristown, N.J.

[21] Appl. No.: 211,018

[22] Filed: Jun. 24, 1988

[51] Int. Cl.⁴ .......................... B44C 1/22; B29C 37/00; C03C 15/00; C03C 25/06
[52] U.S. Cl. ................................. 156/655; 156/659.1; 156/662; 156/668; 156/904; 427/43.1; 430/313; 430/286
[58] Field of Search .................... 156/643, 655, 659.1, 156/662, 668, 904; 427/38, 43.1, 54.1; 430/285, 286, 296, 313, 317; 437/229

[56] References Cited

U.S. PATENT DOCUMENTS

| 4,113,550 | 9/1978 | Saiki et al. | 156/656 |
|---|---|---|---|
| 4,218,283 | 8/1980 | Saiki et al. | 156/656 |
| 4,243,743 | 1/1981 | Hiramoto et al. | 430/281 |
| 4,321,319 | 3/1982 | Shoji et al. | 430/270 |
| 4,329,419 | 5/1982 | Goff et al. | 430/283 |
| 4,353,778 | 12/1982 | Fineman et al. | 156/644 |
| 4,386,116 | 5/1983 | Nair et al. | 427/99 |
| 4,410,612 | 10/1983 | Goff et al. | 430/18 |
| 4,414,312 | 11/1983 | Goff et al. | 430/283 |
| 4,416,973 | 11/1983 | Goff | 430/281 |
| 4,430,418 | 2/1984 | Goff | 430/288 |
| 4,436,583 | 3/1984 | Saiki et al. | 156/659 |
| 4,451,551 | 5/1984 | Katsoka et al. | 430/270 |
| 4,454,220 | 6/1984 | Goff | 430/311 |
| 4,508,749 | 4/1985 | Branson et al. | 427/43.1 |
| 4,547,455 | 10/1985 | Hiramoto | 430/325 |
| 4,565,767 | 1/1986 | Katsoka et al. | 430/196 |
| 4,568,601 | 2/1986 | Araps et al. | 428/167 |
| 4,608,333 | 8/1986 | Ohbayashi et al. | 430/281 |
| 4,656,050 | 4/1987 | Araps et al. | 427/12 |

OTHER PUBLICATIONS

Stephen D. Senturia, Proceedings of the ACS Division of *Polymer Materials: Science and Engineering*, 55, 385,386 (1986).
Ronald J. Jensen, Idem., 55, 414,417 (1986).

Primary Examiner—William A. Powell
Attorney, Agent, or Firm—Harold N. Wells; Thomas K. McBride; Eugene I. Snyder

[57] ABSTRACT

Ethers of oligomeric phenol-dialdehyde condensation products containing vinyl benzyl moieties in at least half of the ether moieties are excellent photosensitive prepolymers. Through simple masking and irradiation with a broad range of radiation types, such a resin as a coating can be selectively patterned by dissolving the non-irradiated and non-photocrosslinked portions of the prepolymer with a large variety of common solvents. The outstanding differential solubility between the photocrosslinked and non-crosslinked regions of the prepolymer allows excellent resolution with good edge sharpness. Subsequent thermal curing affords a void-free infusible glassy solid with minimum shrinkage, excellent planarity characteristics, and high resistance to cracking.

17 Claims, 5 Drawing Sheets

PHOTODEFINABLE INTERLEVEL DIELECTRICS

BACKGROUND OF THE INVENTION

Advances in electronic circuitry seem to be invariably linked to advances in circuit density of integrated circuits. With very large scale integration (VLSI) has come the need for packaging approaches which can provide high density, high speed interconnection between chips while minimizing crosstalk and controlling impedance, yet providing for effective heat removal and environmental protection of discrete components. There is no unique manner of achieving high density interconnections using multiple conductor layers on single boards, but recent years have seen an increased emphasis on, and utilization of, thin film multilayer structures using conventional metallic conductors and polymeric dielectrics.

Among the polymeric dielectrics utilized the class of polyimides (PI) by far are most frequently mentioned. Not only are they used as interlevel dielectrics, but also as passivants (protective coatings), as a filler in isolation trenches within semiconductor devices, and as soldering masks. For polymeric resins to be useful as, for example, a passivant, the material must be an excellent electrical insulator, must adhere well to the substrate, and must provide a barrier for transport of chemical species that could attack the underlying device. When used as an interlevel dielectric, the polymer must withstand 400° C. without degradation of electrical, or mechanical properties. Additionally, the deposition, cure, and etch process must provide for reliable interconnection between the metal layers above and beneath the film. Stephen D. Senturia, Proceedings of the ACS Division of Polymer Materials: Science and Engineering, 55,385,386 (1986). To date polyimides are among the best available candidates to fill this demanding role.

Patterning polyimides can be performed in several ways including wet etching, plasma etching (or reactive ion etching, RIE) and direct photopatterning of photosensitive polyimides (PSPI). Wet etching can pattern only partially cured PI films and is limited to aspect ratios (thickness to feature width) of less than 1:1. RIE involves more steps and more expensive equipment than wet etching, but is capable of patterning high aspect ratio features with nearly vertical sidewalls in thick, fully cured PI film. Ronald J. Jensen, idem., 55,413,417 (1986). Because photopatterning requires fewer steps with significant cost and production advantages there is a great interest in its development, although significant problems remain to be overcome. Cf. Jensen, op. cit.

While the following review is not intended to be exhaustive, advances in and approaches to photopatterning polymeric dielectrics, chiefly as an interlevel dielectric, can be instructively chronicled through efforts of groups at DuPont, Hitachi, Toray, and IBM, and what follows is a brief sojourn through some relevant patent literature coming from these laboratories.

Initial processes employed a photoresist. In this method a coating of polyamide (polyimide precursor) was applied and the dried resin was overlayed with a photoresist, often baked on at moderate temperatures (under 100° C.). The photoresist was irradiated through a masking pattern and subsequent development with an alkaline agent dissolved both the exposed portions of the photoresist and the underlying polyamide film. Exposed portions of the photoresist were then dissolved with, for example, acetone and the remaining polyamide acid film was cured at several hundred degrees centigrade.

Such conventional methods were perceived to have the disadvantages of affording only vias (or openings) between the layers of greater than 10 microns while obtaining good etch definition, and in U.S. Pat. No. 4,113,550 Saiki at Hitachi claimed to have found that etchants of hydrazines and alkaline diamines when used with semicured polyimide precursors in the general method above gave vias with a diameter down to about 3 microns with good etch definition in films about 1 micron thick. In 4,218,283 the method was extended to cured resins and then further extended in 4,436,583 by use of a special negative-type photoresist with reduced permeability to hydrazine-polyamine etchants.

Efforts at Toray were directed toward the elimination of the separate photoresist by providing a photosensitive composition which could be irradiated directly through a suitable mask and then developed with an appropriate solvent to provide the desired pattern. Some initial efforts used as photosensitive compositions a mixture of a polyimide precursor and a photopolymerizable olefin having an amino radical or quaternary ammonium group, such as cinnamic acid esters of disubstituted amino ethyl alcohol, and after irradiation through a mask the unmasked portions were developed by polar aprotic solvents such as N-methylpyrrolidone (NMP), dimethylformamide (DMF), N-methylacetamide (NMA), dimethylsulfoxide (DMSO) and hexamethylphosphoramide (HMP); U.S. Pat. No. 4,243,743. It needs to be emphasized that the polyimide precursors were not themselves photosensitive. The patentees mentioned that photoinitiators and photosensitizers also could be employed. Nonetheless, coatings with a thickness greater than 3 microns required strict control of development time to obtain a developed layer of relatively uniform thickness, and coatings under 3 microns were difficult to develop without degrading relief structures, evidently because of insufficient differential solubility of the photocrosslinked and non-crosslinked polymer precursor. In 4,547,455 this problem was addressed by using a new developer system of a mixture of the polar aprotic solvents previously used with methanol and the lower alkyl monoethers of diethylene glycol (Carbitols). This same problem appears to have been recognized by Kataoka et al. at Hitachi who in 4,565,767 described a light sensitive polymer composition of a polyamic ester, a special class of photosensitive bisazides, and a tertiary amine. An object of their work was greater differential solubility of photocrosslinked and unpolymerized resins. A further refinement was disclosed by Toray in 4,608,333 where the patentee teaches a photosensitive composition of polyimide precursor, a class of photodi- or photopolymerizable olefins as taught in '743, and certain aromatic or tertiary amines "chemically inactive to actinic radiation" where the mixture displayed improved radiation sensitivity, i.e., required less exposure time.

At DuPont the focus appeared to be on radiation sensitive polyimide precursors themselves. In U.S. Pat. No. 4,329,419 Goff teaches a polyamide ester resin (polyimide precursor) containing as photopolymerizable moieties polyfunctional acrylates in the ester portion of the resin, along with aromatic biimidazoles as photopolymerization initiators. The uncured resin film was irradiated through a mask and non-crosslinked resin was dissolved with, for example, polar aprotic solvents and monoethyl ethers of ethylene glycol. Exposure times of under 30 seconds were needed for film thickness of about 1.25 microns with subsequent development times of about 10 seconds. Compare also 4,410,612; 4,414,312; 4,416,973; 4,430,418; and 4,454,220.

This approach was echoed by Hitachi in 4,321,319 where the patentee taught a photosensitive polyamide acid resulting from reaction of a tetracarboxylic acid anhydride or tricarboxylic acid anhydride monohalide with a photosensitive diamine, the photosensitive group being, for example, an acrylate or cinnamate bound to the ring of an aromatic diamine. The photosensitive polymer also necessarily contains a photosensitizer. Kataoka et al. subsequently disclosed a variant where the light sensitivity of the polyamide acid arose from incorporation of an aromatic azide or sulfonyl azide, but still required a photosensitizer; U.S. Pat. No. 4,451,551.

The initial patents originating from IBM also appear to utilize a photoresist (U.S. Pat. Nos. 4,353,778 and 4,386,116) although direct etching with high energy ultraviolet light (40–400 nm) was disclosed in U.S. Pat. No. 4,508,749. The most relevant prior art for the purpose of our invention appears to be that of Araps et al., U.S. Pat. Nos. 4,568,601 and 4,656,050. The patentee teaches a method of irradiation and polymerization of dielectrics enabling the use of such polymeric dielectrics as photoresists in general. The invention facilitates in situ cure when the polymeric dielectrics are used to produce isolation films in multilayer devices, to fill isolation trenches within semiconductor structures, and for similar applications. The polymerizable oligomers are selected from the group consisting of poly N-substituted amic acids, the corresponding amic esters and isoimides, corresponding imides and mixtures thereof, where the polymerizable oligomer is end-capped with a vinyl or acetylenic moiety and can be coupled and crosslinked using radiation as the method of initiating reaction. The vinyl or acetylenic moieties responsible for the photosensitivity and photopolymerization of the oligomeric polyimide precursors are only at the termini of the oligomers and are bonded to terminal benzene rings attached to the imide nitrogen. It is noteworthy that the patentees used only electron beams irradiation as their method of curing and actually used only the acetylenic group for end-capping. When the unexposed portion was developed by 2-methoxyethyl ether image patterns as small as 0.5 microns wide could be obtained in a film somewhat greater than 2microns thick.

One striking feature which emerges from the foregoing review is the invariant use of polyimides as the photodefinable polymeric resin. However, such use of polyimide precursors and polyimides is accompanied by problems inherent in these materials themselves. Thus, an unacceptably large amount of volatiles is generated in the thermocycle necessary for curing of the polyimide precursor. These volatiles, which include water, carbon dioxide, nitrogen, and low molecular weight acrylates, lead to voids and cracks in the cured resin and to shrinkage in its preparation. Polyimides are hygroscopic which affects dielectric constant, and the changes in the dielectric constant with relative humidity often necessitate that the device be hermetically sealed. Polyimides also exhibit poor adhesion to themselves and to metals. A further defect with polyimides is that their coefficient of thermal expansion may be too high relative to other materials on the densely packaged electronic circuit.

In contrast, the photodefinable and photopolymerizable oligomers of our invention generate no volatiles either in the photochemical or thermal curing cycle. The cured resin exhibits a low coefficient of thermal expansion, especially along the z axis. The cured resin absorb a very low quantity of water, typically under 0.3% at 50% relative humidity, ensuring that the dielectric constant is relatively insensitive to humidity changes. In addition, the cured resins of this invention typically have a lower dielectric constant than polyimides, thereby permitting denser packaging than is the case with polyimide resins. Our cured resins also show a high glass transition temperature with good selfadhesion and good adhesion to metals. The photosensitive oligomeric resins of our invention are soluble in many converted solvents, in contrast to the need for using polar aprotic solvents for polyimides, which generally simplifies working with our resin and permits the use of many relatively low boiling solvents. The photosensitive resins of this invention also exhibit excellent planarization of the polymer, a particularly desirable property of interlevel dielectrics. Our materials photochemically crosslink throughout the thickness of the film, that is, there is no self-absorption of irradiation, with the result that the pattern shows no undercutting on development. In summary, and quite concisely, the materials of this invention provide photosensitive and photopolymerizable resins with excellent resolution and edge definition, superior differential solubility between the photocrosslinked and noncrosslinked oligomeric resin, do not need a photosensitizer or photoinitiator, and afford a cured resin which is superior in most of its properties to polyimides, the current industry standard.

SUMMARY OF THE INVENTION

The purpose of this application is to use a photodefinable oligomeric resin other than a polyamide as an interlevel dielectric in the preparation of high density electronic circuits. An embodiment comprises coating a substrate with a phenolic oligomer which is the condensation product of selected dialdehydes with a phenol, said condensation products being ethers where at least half of the ether moieties is a vinylbenzyl moiety, selectively irradiating the coating to crosslink the oligomeric prepolymer, dissolving the non-irradiated portions of the coating, and thermally curing the remaining photochemically crosslinked portions of the coating to afford a very high molecular weight polymer as an infusible and glassy solid. In an embodiment the dialdehydes are terminal alkylene dialdehydes containing from 2 to 8 carbon atoms. In another embodiment from about 3 to about 4 molar proportions of the phenol are used in condensation with the dialdehyde. In a still more specific embodiment the dialdehyde is succindialdehyde. In yet another specific embodiment the ether moieties other than vinylbenzyl are primary alkyl groups. Other objectives and embodiments will be apparent from the following description, and all are intended to be included herein.

DESCRIPTION OF THE INVENTION

Figure 1:
FIGS. 1–5 are photodefinable films of an ether of styrene terminated tetraphenol ethane, where the ether groups are 70-30 vinylbenzyl/propyl, cured at 275° C.

The phenolic oligomers used as photodefinable dielectrics are the condensation products of 1 molar proportion of selected dialdehydes with from 3 to about 4 molar proportions of a phenol. Although more than 4 molar proportions of a phenol can be used in the practice of this invention, no more than 4 molar proportions will react with the dialdehydes, as will be elaborated upon within.

One class of dialdehydes which may be used in this invention is the class of linear, terminal alkylene dialdehydes of formula $OHC(CH_2)_nCHO$ where n is 0 or an integer from 1 to 6. Such dialdehydes include glyoxal, malondialdehyde, succindialdehyde, glutaraldehyde, adipaldehyde, pimelaldehyde, and sebacaldehyde. Those aldehydes where n is 0–4 are particularly preferred, and glyoxal (n=0) is especially favored in the practice of this invention.

Another class of aldehydes which may be employed in preparation of the oligomeric condensation products include cyclopentanedione, cyclohexanedione, phthalaldehyde, isophthalaldehyde, terephthalaldehyde, the hexahydrophthalaldehydes (i.e., the reduced counterpart of the phthalaldehydes where the aromatic ring has been reduced to a cyclohexane ring), cycloheptanedialdehyde, and cyclooctanedialdehyde.

The oligomers are the condensation product of 1 molar proportion of the aforementioned dialdehydes with from 3 to about 4 molar proportions of a phenol. The phenol is of the general structure $R_1C_6H_4OH$ where $R_1$ is hydrogen or an alkyl group containing from 1 through about 8 carbon atoms. The most desirable phenol is phenol itself, that is, the case where $R_1$ is hydrogen. Where $R_1$ is an alkyl group it is most desirable that the alkyl group contain from 1 to about 4 carbon atoms, and cresol, the case where $R_1$ is a methyl group is another preferred species of phenol.

The condensation product is analogous to phenol-formaldehyde resins. That is, the products result from the condensation of 2 molar proportions of a phenol with each aldehyde group. In the simplest case, which can be looked at as the "monomeric" product, using phenol and glyoxal to exemplify the reaction, the product has the structure

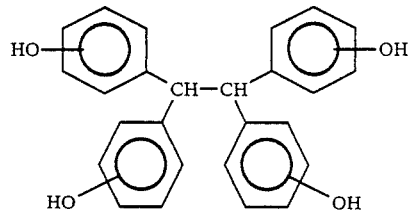

where the hydroxyls are almost exclusively ortho and para, and largely para, to the point of condensation of the phenol and glyoxal. However, the product above has 4 phenolic groups per molecule, and any one of these may react with another molecule of glyoxal which then further condenses with three other molecules of phenol to give the structure,

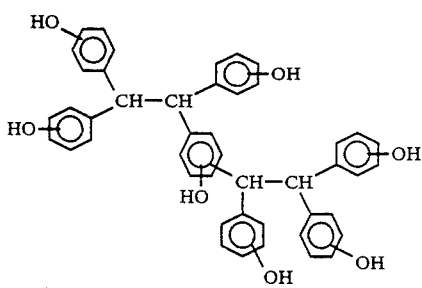

The oligomeric product above results from a molar proportion of 7 phenols to 2 glyoxals. This oligomer in turn can react with another molecule of glyoxal and the latter can react further with 3 additional phenols to give the next higher oligomer of the structure

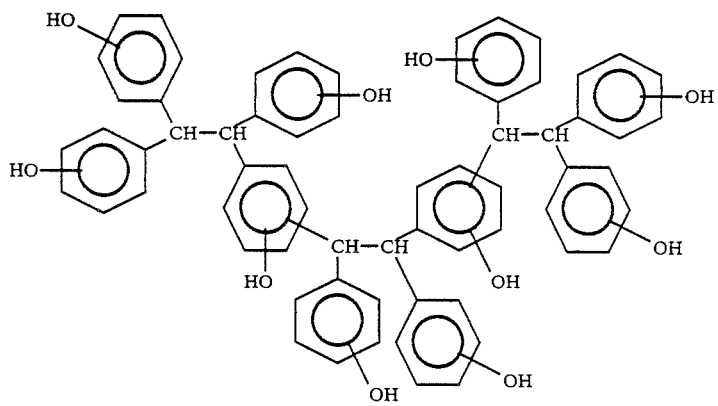

which has the molar ratio of 10 phenolic groups to 3 glyoxals. In a similar fashion, the next higher oligomer has a molar ratio of phenol to glyoxal of 13:4, the next higher of 16:5, and so forth, with the limiting molar ratio being 3:1. It needs to be mentioned that a ratio less than 3:1 will never be achieved without internal cyclization, i.e., one molecule of glyoxal is required to react with at least 2 phenolic moieties of the oligomer. In a similar fashion, the condensation product which is the "monomer" has a limiting ratio of phenol-glyoxal of 4:1.

The condensation products are themselves phenols, as mentioned above, and are a mixture of oligomers. This mixture can be characterized by the number of phenolic moieties per molecule. In the practice of this invention we are concerned with those condensation products which have from 4 to about 60 phenolic moieties per molecule, and more usually between four and about 22 phenolic moieties per molecule. The product being a mixture of oligomers, the preferred mixture is characterized by having as an average between about 5 and about 8 phenolic moieties per molecule.

More specifically, where the dialdehyde is glyoxal and the phenol is phenol itself each oligomeric product has a molecular weight between about 400 and 6000, and more desirably between about 400 and about 2200. The mixture of oligomeric products may be characterized by an average molecular weight of between about 500 and about 800.

The photodefinable oligomers of this invention are ethers of the aforedescribed oligomeric condensation products which are capped so as to convert substantially all (greater than about 99.5%) of the hydroxyls to ether moieties. Each of the ether moieties is randomly selected from the group consisting of vinylbenzyl, alkyl containing 1 to 10 carbon atoms, cycloalkyl of from 5 to 10 carbon atoms, and benzyl moieties where the ratio of the vinylbenzyl to all other moieties is at least 1:1. The vinylbenzyl moiety has the structure

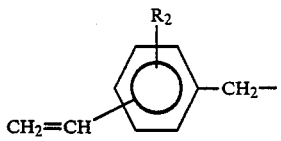

where the vinyl group is either meta or para to the $CH_2$, and which usually is a mixture of the meta and para-isomers. $R_2$ is a chemically inert substituent selected from the group consisting of hydrogen, alkyl moieties containing from 1 to about 10 carbon atoms, alkoxy moieties containing from 1 to about 10 carbon atoms, and monovalent radicals whose parent is an aromatic hydrocarbon. In the usual case $R_2$ is hydrogen.

The other ether groups which may be used in the practice of this invention include an alkyl group containing from 1 to 10 carbons, a cycloalkyl group having 5 to 10 carbons, or a benzyl group. Where the ether moiety is an alkyl group, the lower alkyl group containing from 1 to 4 carbon atoms are given priority, especially the primary alkyl groups. Thus, the most desirable alkyl groups consist of methyl, ethyl, 1-propyl, 1-butyl, and 2-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth. However, it is to be emphasized that a benzyl group also operates quite satisfactorily in the practice of our invention. The most common cycloalkyl groups used in out invention are 5- and 6-membered cycloalkanes, unsubstituted or alkyl substituted so as to contain 5 to 10 carbon atoms. Examples are cyclopentyl, cyclohexyl, methylcyclopentyl, dimethylcyclopentyl, ethylcyclopentyl, propylcyclopentyl, butylcyclopentyl, pentylcyclopentyl, ethylmethylcyclopentyl, methylpropylcyclopentyl, butylmethylcyclopentyl, methylcyclohexyl, dimethylcyclohexyl, ethylcyclohexyl, propylcyclohexyl, butylcyclohexyl, and so forth. Alkyl groups containing 1 through about 4 carbon atoms are especially desirable, and among these the primary alkyl groups are particularly favored with the 1-propyl moiety being especially recommended. It also needs to be mentioned that the vinylbenzyl and other ether moieties are randomly distributed among the aromatic rings.

The photodefinable oligomeric resins of this invention may be prepared by any convenient method known in the art. The ethers are most readily prepared by reacting a vinylbenzyl halide with the phenolic condensation products followed by reaction of the partially etherified material with another suitable halide, such as an alkyl halide. However, an alternative to the sequential reaction is a reaction of a mixture of a vinylbenzyl halide with the oligomeric condensation products. Generally a mixture of the meta- and paraisomers of vinylbenzyl chloride are used, where the bromide and, to a lesser extent, the iodide also may be used. The reaction may be conveniently performed in an alcoholic potassium hydroxide solution, often containing an acetone or some other organic cosolvent, at the reflux temperature.

The foregoing photodefinable and photosensitive oligomeric resins have uses such as a passivant, as an interlevel dielectric, as a means of providing device deep dielectric isolation (insulator isolating trenches), as a high temperature solder mask, a photoresist, etc. Although much of what follows describes its use primarily as an interlevel dielectric, the skilled worker will recognize from this description how to use the materials of my invention in other applications as well.

The photodefinable and photosensitive oligomer resin is applied as a coating to a suitable substrate. For the most part the substrates used will be a silicon wafer, a silicon chip of an integrated circuit, a printed circuit board or a ceramic substrate. The photosensitive oligomeric resin may be applied by spin coating, spray coating, by use of a doctor knife, or any other conventional techniques known in the art. The method of application is unimportant; what is important is obtaining a uniform coating, and any procedure affording that result may be used. Where the viscosity of the photosensitive oligomer resin is too high to permit even flow for a uniform coating, a solution of the resin in a suitable solvent may be used. The resins of this invention are soluble in a broad class of solvents including polar aprotic solvents, aromatic hydrocarbons, halogenated hydrocarbons, ketones, esters, and so forth. Examples of solvents which may be employed in the practice of our invention include dimethylformamide (DMF), hexamethylphosphoramide (HMPA), N-methylacetamide (NMA), dimethylsulfoxide (DMSO), N-methylpyrrolidone (NMP), benzene, toluene, xylene, dichloromethane, chloroform, carbon tetrachloride, chlorobenzene, tetrachloroethane, tetrachloroethylene, trichloroethane, gamma-butyrolactone, methyl ethyl ketone, diethyl ketone, hexanone, heptanone, octanone, methyl acetate, ethyl acetate, methoxy ethanol, ethoxy ethanol, and so forth. It needs to be emphasized that the nature of the solvent is not important so long as it is otherwise unreactive with both the substrate and the photosensitive oligomeric resin and dissolves the resins to provide at least about a 10 weight-volume percent solution. Since the solvent is typically removed prior to further processing, it is also preferably that as low boiling a solvent as possible be used consistent with the foregoing consideration.

Although the oligomeric resins of this invention may be photopolymerized directly, a photosensitizer may be used without harm, and in fact in some instances may be useful to decrease irradiation time. Where a photosensitizer is used it will be added with the oligomeric resin at the coating stage and will be present in an amount from about 0.001 to about 5.0 weight percent relative to the oligomeric resins. Examples of photosensitizers which may be successively used in the practice of this invention include such materials as benzophenone, 4,4'-bis(-dimethylamino)benzophenone, xanthone, acetophenone, 4-trifluoromethyl-acetophenone, triphenylene, thioxanthone, anthraquinone, 4-phenylbenzophenone, naphthalene, 2-acetonaphthalene, 1-acetonaphthalene, chrysene, anthracene, 9,10-dichloroanthracene, pyrene, triphenylene, 1-fluoronaphthalene, 1-chloronaphthalene, 1-bromonaphthalene and 1-iodonaphthalene.

Where the photosensitive oligomeric resin has been applied as a solution to the substrate the solvent used must be removed prior to irradiation. Consequently it is conventional to heat the coated substrate for a time sufficient to remove essentially all of the solvent present, if any, prior to irradiation, a stage known as the softbake. It is for this reason that the use of a low boiling solvent is preferred. It is acceptable to use enough heat to provide a semicured resin, especially since the resins of this invention may begin to cure at temperatures as low as about 110° C. What needs to be emphasized is that although a partially cured or semicured resin is not deleterious to the practice of our invention it is also not a necessary prerequisite for its successful practice. The softbake can be carried out in vacuum, under an inert atmosphere (e.g., nitrogen, helium, argon, etc.) or in air.

The coated substrate is then masked and irradiated. That is, a mask containing the desired pattern or image is placed on or adjacent to a coated substrate and the coated oligomeric resin is then irradiated through the mask. The coated resin may be irradiated by x-ray, electron beam, ion beam, ultraviolet, or visible radiation. However, for reasons of economy and ease of fabrication it is preferred to use radiation in the range from about 200 to about 800 nanometers. Because of the well known fact that lower wave length radiation tends to afford better resolution, irradiation in the 200–500 nm range is preferred. With this treatment the irradiated portion of the coated resin becomes crosslinked with the photocrosslinked resin exhibiting rather high insolubility in the same solvent in which the original photosensitive oligomeric resin remains quite soluble.

Irradiation may be done in either the presence or absence of oxygen. Exposure time necessary for adequate photocrosslinking to afford the differential solubility characteristic sought depends upon the wavelength of the light used, its intensity, the presence or absence of a photosensitizer, and so forth, with a variation from a few seconds up through several minutes. For production purposes the shorter exposure times are highly preferred. One desirable characteristic of the photosensitive oligomeric resins of this invention is that they photochemically crosslink throughout the thickness of the film. That is, there is no self-absorption of light, and therefore the pattern shows no undercutting upon development.

The selective pattern appears upon development with the solvent. As mentioned above, upon irradiation the photosensitive oligomeric resin becomes extensively crosslinked with a subsequent large differential solubility between the crosslinked, or irradiated, and non-crosslinked, or non-irradiated, portions of the oligomeric resins. The solvents used in the development are not critical to the success of this invention and are, for the most part, the same ones used in preparing a solution of the resin for coating purposes. Thus, classes of solvents include aprotic solvents, aromatic hydrocarbons, halogenated hydrocarbons, ketones, esters, the Carbitols, and so on. It needs to be emphasized that, in constant to certain of the prior art, the nature of the solvent is not critical in the successful practice of this invention. An important feature which distinguishes this invention and which makes its practice relatively facile is the high differential solubility between the photocrosslinked portion of the oligomeric ester and the non-crosslinked precursor.

Upon development selective patterns appear where the elevated portions correspond to the photochemically crosslinked resins. These relief structures are then thermally cured to afford a highly crosslinked, infusible, glassy solid highly resistant to elevated temperatures, chemical degradation, ion transport, and which serves as an effective protective layer and dielectric insulator. Curing is attended by crosslinking of the vinyl groups and may be effected either thermally, chemically, or photochemically, with thermal curing preferred. Thermal curing is generally done in the temperature range between about 110° and about 275° C., and often is done in stages. So, for example, curing may first be effected at a temperature between about 150° and about 200° C. for 0.5–5 hours with postcuring at about 180°–275° C. for about 0.5–24 hours. Curing also may be brought about using a free radical initiator, such as azo-bis-isobutyronitrile, benzoyl peroxide, di-t-butylperoxide, and so on.

The following examples are only illustrative of our invention and are not intended to limit it in any way. Other variants will become immediately apparent to the skilled worker and are intended to be within the scope of our invention.

EXAMPLE 1

Synthesis of Styrene-Terminated Tetraphenol Ethane (70% Vinylbenzyl/30% Propyl) (STTPE(70 VBz/30 Pr)).

To a 250 ml round bottom, 3 neck flask equipped with a stirring shaft, an addition funnel and a condenser was added 25.0 g tetraphenol ethane (TPE) ($Mn=274$, $Mw=711$) (0.0354 mol), 0.23 g BHT (0.00106 mol) and 120 ml N-methyl pyrrolidinone (NMP). Upon dissolution of the TPE, 26.48 g vinylbenzyl chloride (VBC) (0.174 mol) were added and the vessel flushed and placed under positive nitrogen pressure be means of a mineral oil bubbler. The solution was heated to 60° C. by means of a water bath and 11.34 g KOH (0.177 mol) dissolved in 25 ml of methanol were added dropwise over 30 minutes. The mixture was kept at 60° C. for an additional 3.5 hours. 9.0 ml 1-bromopropane (0.099 mol) were then added. 4.86 g KOH (0.0758 mol) dissolved in 11 ml methanol were then added dropwise over 30 minutes and the temperature maintained at 50° C. an additional 1.5 hours.

The mixture was cooled and slowly added to 600 ml of methanol leaving a solid yellow mass. The methanol was decanted and the solids along with fresh methanol were placed in a blender to produce an oily solid which was collected on a Buchner funnel. This material was dissolved in dichloromethane and washed with 4×500 ml water. The organic phase was dried over sodium sulfate and filtered through Celite. Solvent was removed by rotary evaporation leaving an orange semi-solid, 49% yield. GPC examination of resin indicates $Mn=1040$, $Mw=1290$, dispersity 1.24. Infrared examination of resin indicates some residual OH (<5%), ion chromatography indicates: 17 ppm Cl⁻ <1 ppm Br⁻,1 ppm $SO_4^{-2}$. 3.0 g of STTPE (70 VBz/30 Pr) was dissolved in ca.5 ml of acetone and cured in a flat mold by heating at 80° C. for 2 hours, 100° C. for 16 hours, 120° C. for 4 hours, 160° C. for 16 hours, 200° C. for 4 hours then 225° C. for 1 hour. Analysis of the cured polymer disclosed the following properties.

TABLE 1

| Tg(°C.)[a] DSC | Tsp(°C.)[b] TMA | $\alpha_g$[c] (ppm/°C.) | $\alpha_{260}$[d] (ppm/°C.) | $\epsilon'/\tan\delta$[e] 0% RH[f] | $\epsilon'/\tan\delta$[e] 50% RH | H2O[g] absorption (wt %) |
|---|---|---|---|---|---|---|
| >300 | 167 ± 13 | 60 ± 2 | 79 ± 2 | 3.07/0.001 | 3.29/0.007 | 0.15 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tanδ the dissipation factor, measured at 1 MHz, 25° C., two-fluid cell.
[f.] Relative humidity.
[g.] Weight gain after two weeks at 50% relative humidity.

EXAMPLE II

Synthesis of Styrene Terminated Tetraphenol Ethane (70% Vinylbenzyl/30% Propyl) STTPE (70 VBz/30 Pr)).

To a 1 L round bottom, 3 neck flask equipped with a stirring shaft, an addition funnel and a condenser was added 50.0 g tetraphenol ethane (TPE) (Mn=274, Mw=711) (0.0708 mol). 0.47 g BHT (0.00212 mol) and 240 ml N-methyl pyrrolidinone (NMP). Upon dissolution of the TPE, 52.96 g vinylbenzyl chloride (VBC) (0.347 mol) were added and the vessel flushed and placed under positive nitrogen pressure by means of a mineral oil bubbler. The solution was heated to 60° C. by means of a water bath and 22.70 g KOH (0.354 mol) dissolved in 60 mol of methanol were added dropwise over 30 minutes. The mixture was kept at 60° C. for an additional 3 hours. 13.5 ml 1-bromopropane (0.149 mol) were then added. 10.2 g KOH (0.158 mol) dissolved in 25 ml methanol were then added dropwise over 15 minutes and the temperature maintained at 60° C. an additional 1.75 hours. An additional 9.0 ml 1-bromopropane were added followed by 6.35 g KOH (0.099 mol) dissolved in 20 ml methanol which were added dropwise over 20 minutes. The mixture was maintained at 60° C. for an additional hour.

The mixture was cooled and slowly added to 5L of methanol leaving a solid yellow mass. The methanol was decanted and the solids along with fresh methanol were placed in a blender to produce an oily solid which was collected on a Buchner funnel. This material was dissolved in dichloromethane an washed with 4×500 ml water. The organic phase was dried over sodium sulfate and filtered through Celite. Solvent was removed by rotary evaporation leaving an orange semisolid, 57% yield. GPC analysis indicates resin to have Mn= 899, Mw=2410, dispersity 2.68; Infrared analysis indicates low residual OH (<5%); Ion Chromatography analysis indicates; 13 ppm Cl⁻, <1 ppm Br⁻, 26 ppm $SO_4^{-2}$. STTPE (70 VBz/30 Pr) was cured according to the aforementioned cure cycles. Samples are identified as follows:
  A: Cast from toluene
  B: Cast from acetone

TABLE 2

| | Tg(°C.)[a] DSC | Tsp(°C.)[b] TMA | $\alpha_g$[c] (ppm/°C.) | $\alpha_{260}$[d] (ppm/°C.) | $\epsilon'/\tan\delta$[e] 0% RH[f] | $\epsilon'/\tan\delta$[e] 50% RH | H2O[g] absorption (wt %) |
|---|---|---|---|---|---|---|---|
| Sample | | | | | | | |
| A | >300 | 167 ± 11 | 62 ± 5 | 66 ± 4 | 3.07/0.002 | 3.13/0.005 | 0.46 |
| B | >300 | h | h | 51 ± 2 | 3.06/0.003 | 2.73/0.007 | 0.21 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tanδ the dissipation factor, measured at 1 MHz, 25° C., two-fluid cell.
[f.] Relative humidity.
[g.] Weight gain after two weeks at 50% relative humidity.
[h.] Not observed

EXAMPLE III

Synthesis of Styrene Terminated Tetraphenol Ethane (50% Vinylbenzyl/50% Propyl) (STTPE (50 VBz/50 Pr)).

To a 2 L, 3 neck round bottom flask equipped with a stirring shaft, an addition funnel and a condenser was added 100.0 g tetraphenol ethane (TPE) (Mn=273, Mw=711) (0.142 mol), 0.94 BHT (0.00426 mol) and 475 ml N-methyl pyrrolidinone (NMP). Upon dissolution of the TPE, 75.66 g vinylbenzyl chloride (VBC) (0.496 mol) were added and the vessel flushed and placed under positive nitrogen pressure by means of a mineral oil bubbler. The solution was heated to 60° C. by means of a water bath and 32.44 g KOH (0.506 mol) dissolved in 75 ml of methanol were added dropwise over 30 minutes. The mixture was kept at 60° C. for an additional 3 hours. 54.0 ml 1-bromopropane (0.595 mol) were then added. 32.44 g KOH (0.506 mol) dissolved in 75 ml methanol were then added dropwise over 30 minutes and the temperature maintained at 60° C. an additional 2.5 hours.

The mixture was cooled and slowly added to 7.5 L of rapidly stirred methanol leaving a solid yellow mass. The methanol was decanted and the solids along with fresh methanol were placed in a blender to produce an oily solid which was collected on a Buchner funnel. This material was dissolved in dichloromethane and washed with 3×500 ml water. The organic phase was dried over sodium sulfate and filtered through Celite. Solvent was removed by rotary evaporation leaving an orange semi-solid, 53% yield. GPC analysis of the resin indicates Mn=797, Mw=1076, dispersity 1.35; Infrared analysis indicates the presence of very small residual OH (<2%); Ion Chromatography analysis found; 9 ppm Cl$^-$<1 ppm Br$^-$, 79 ppm SO$_4$$^{-2}$. STTPE (50 VBz/50 Pr) was cast and cured according to curing procedure hereinbefore set forth in the above examples. Samples are identified as follows.
A: Cast from acetone
B: Cast from toluene

TABLE 3

| | Tg(°C.)$^a$ DSC | Tsp(°C.)$^b$ TMA | $\alpha_g{}^c$ (ppm/°C.) | $\alpha_{260}{}^d$ (ppm/°C.) | $\epsilon'$/tan$\delta{}^e$ 0% RH$^f$ | 50% RH | H2O$^g$ absorption (wt %) |
|---|---|---|---|---|---|---|---|
| Sample | | | | | | | |
| A | >300 | 134 ± 5 | 68 ± 1 | 79 ± 1 | 3.10/ 0.003 | 3.24/ 0.005 | 0.13 |
| B | >300 | 230 ± 4 | 77 ± 2 | 84 ± 2 | 3.00/ 0.002 | 3.21/ 0.005 | 0.07 |

$^a$ Glass temperature.
$^b$ Softening point.
$^c$ Coefficient of thermal expansion from 25° C. to Tsp.
$^d$ Coefficient of thermal expansion from 25° C. to 260° C.
$^e$ $\epsilon'$ is the dielectric constant, tan$\delta$ the dissipation factor, measured at 1 MHz, 25° C., two-fluid cell.
$^f$ Relative humidity.
$^g$ Weight gain after two weeks at 50% relative humidity.

settled out. The methanol was decanted and the oil was dissolved in dichloromethane and washed with 3×500 ml water. The organic phase was dried over sodium sulfate and filtered through Celite. Solvent was removed by rotary evaporation leaving a brown oil, 55% yield. GPC analysis indicates Mn=924, Mw=1217 dispersity 1.32; Infrared analysis indicates no residual OH (<0.5%); Ion Chromatography analysis found: 7 ppm Cl$^{31}$, <3 ppm Br$^-$, 64 ppm SO$_4$$^{-2}$. STTPE (50 VBz/50 Hx) was cast and cured according to the curing procedure hereinbefore set forth in the above examples. Samples are identified as follows:
A: Cast from acetone B: Cast from toluene

TABLE 4

| | Tg(°C.)$^a$ DSC | Tsp(°C.)$^b$ TMA | $\alpha_g{}^c$ (ppm/°C.) | $\alpha_{260}{}^d$ (ppm/°C.) | $\epsilon'$/tan$\delta{}^e$ 0% RH$^f$ | 50% RH | H2O$^g$ absorption (wt %) |
|---|---|---|---|---|---|---|---|
| Sample | | | | | | | |
| A | >300 | 90 ± 15 | 86 ± 5 | 107 ± 1 | 3.08/ 0.005 | 3.13/ 0.006 | 0.12 |
| B | >300 | 131 ± 13 | 79 ± 1 | 113 ± 4 | 2.99/ 0.005 | 3.17/ 0.007 | 0.13 |

$^a$ Glass transition temperature.
$^b$ Softening point.
$^c$ Coefficient of thermal expansion from 25° C. to Tsp.
$^d$ Coefficient of thermal expansion from 25° C. to 260° C.
$^e$ $\epsilon'$ is the dielectric constant, tan$\delta$ the dissipation factor, measured at 1 MHz, 25° C., two-fluid cell.
$^f$ Relative humidity.
$^g$ Weight gain after two weeks at 50% relative humidity.

EXAMPLE IV

Synthesis of Styrene Terminated Tetraphenol Ethane (50% vinylbenzyl/50% Hexyl) (STTPE (50 VBz/50 Hx)).

To a 2 L, 3 neck round bottom flask equipped with a stirring shaft, an addition funnel and a condenser was added 100.0 g tetraphenol ethane (TPE) (MN=274, Mw=711) (0.142 mol), 0.94 g BHT (0.00426 mol) and 475 ml N-methyl pyrrolidinone (NMP). Upon dissolution of the TPE, 75.66 g vinylbenzyl chloride (VBC) (0.496 mol) were added and the vessel flushed and placed under positive nitrogen pressure by means of a mineral oil bubbler. The solution was heated to 60° C. by means of a water bath and 32.44 g KOH (0.506 mol) dissolved in 75 ml of methanol were added dropwise over 30 minutes. The mixture was kept at 60 ° C. for an additional 3 hours. 83.5 ml 1-bromohexane (0.595 mol) were then added. 32.44 g KOH (0.506 mol) dissolved in 75 ml methanol were then added dropwise over 30 minutes and the temperature maintained at 60° C. an additional 2.5 hours.

The mixture was cooled and slowly added to 7.5 L of rapidly stirred methanol leaving an oil that gradually

EXAMPLE V

Synthesis of Styrene Terminated Tetraphenol Ethane (50% Vinylbenzyl/50% Benzyl (STTPE (50 VBZ/50 Bz)).

To a 2 L, 3 neck round bottom flask equipped with a stirring shaft, an addition funnel and a condenser was added 150.0 g tetraphenol ethane (TPE) (Mn=274, Mw=711) (0.212 mol), 1.40 g BHT (0.00637 mol) and 700 ml N-methyl pyrrolidinone (NMP). Upon dissolution of the TPE, 113.24 g vinylbenzyl chloride (VBC) (0.742 mol) were added and the vessel flushed and placed under positive nitrogen pressure by means of a mineral oil bubbler. The solution was heated to 60° C. by means of a water bath and 47.58 g KOH (0.742 mol) dissolved in 110 ml of methanol were added dropwise over 30 minutes. The mixture was kept at 60° C. for an additional 2.25 hours. 94.0 ml benzyl chloride (0.816 mol) were then added. 47.58 g KOH (0.742 m mol) dissolved in 110 ml methanol were then added dropwise over 30 minutes and the temperature maintained at 60° C. an additional 3 hours.

The mixture was cooled and divided into two fractions. The first fraction A was mixed with 750 ml dichloromethane and washed with 2×2 L water and 2×2 L 0.5M NaCl (aq). The second fraction B was slowly added to 5 L of rapidly stirred methanol leaving an oily mass. The methanol was decanted and the oil was dissolved in dichloromethane and washed with 3×1 L water. The organic phase from each fraction was dried over sodium sulfate and filtered through Celite. Solvent was removed by rotary evaporation leaving an oil for sample A (STTPE (50 VBz/50 Bz)-A) and a semi-solid for sample B (STTPE (50 VBz/50 Bz)-B). The overall yield (fractions A and B combined) of the reaction was 66%. Analysis of fraction A found: Mn=761, Mw=3890, dispersity 5.11; Infrared analysis indicates no residual OH (<0.5%); Ion Chromatography analysis found; 18 ppm Cl$^-$ <3 ppm Br$^-$, 9 ppm SO$_4^{-2}$. Analysis of fraction B found: Mn=921, Mw=1560, dispersity 1.69; Infrared analysis indicates no residual OH (<0.5%); Ion Chromatography shows: 12 ppm Cl$^-$, <3 ppm Br$^-$, 11 ppm SO$_4^{-2}$. STTPE (50 VBz/50 Bz)-A and STTPE (50 VBz/50 Bz)-B were cured according to the aforementioned curing schedule set forth in the above examples. Samples are identified as follows:

A: STTPE (50 VBz/50 Bz)-A Cast from acetone.
B: STTPE (50 VBz/50 Bz)-A Cast from toluene.
C: STTPE (50 VBz/50 Bz)-A Cast neat with no solvent.
D: STTPE (50 VBz/50 Bz)-B Cast from acetone.
E: STTPE (50 VBz/50 Bz)-B Cast from toluene.

EXAMPLE VI

Synthesis of Styrene Terminated Tetraphenol Ethane (70% Vinylbenzyl/30% Propyl) (STTPE (70 VBz/30 Pr)).

To a 2 L, 3 neck round bottom flask equipped with a stirring shaft, an addition funnel and a condenser was added 150.0 g tetraphenol ethane (TPE) (Mn=274, Mw=711) (0.212 mol), 1.40 g BHT (0.00637 mol) and 700 ml N-methyl pyrrolidinone (NMP). Upon dissolution of the TPE, 158.53 g vinylbenzyl chloride (VBC) (1.04 mol) were added and the vessel flushed and placed under positive nitrogen pressure by means of a mineral oil bubbler. The solution was heated to 60° C. by a water bath and 68.02 g KOH (1.06 mol) dissolved in 150 ml of methanol were added dropwise over 30 minutes. The mixture was kept at 60° C. for an additional 3.5 hours. 54.0 ml 1-bromopropane (0.595 mol) were then added. 29.12 g KOH (0.454 mol) dissolved in 56 ml methanol were then added dropwise over 30 minutes and the temperature maintained at 60° C. an additional 2 hours.

The mixture was cooled and 1 L dichloromethane added. The mixture was washed with 4×2.5 L water, dried over sodium sulfate and filtered through Celite. Solvent was removed by rotary evaporation up to 40° C. at 3 torr leaving an extremely viscous brown resin, 84% yield. GPC analysis found Mn=766, Mw=3010, dispersity 3.93; Infrared analysis indicates no residual OH (<0.5%); Ion Chromatography found: 9 ppm Cl$^-$, 3 ppm Br$^-$, 25 ppm SO$_4^{-2}$. STTPE (70 VBz/30 Pr) was cast and cured according to the curing procedure hereinbefore set forth in the above examples. Samples are identified as follows:

A: Cast from toluene
B: Cast from acetone.

TABLE 5

| Sample | Tg(°C.)[a] DSC | Tsp(°C.)[b] TMA | $\alpha_g$[c] (ppm/°C.) | $\alpha_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|---|
| A | >300 | 153 ± 5 | 64 ± 5 | 92 ± 5 | 3.08/0.001 | 3.12/0.001 | 0.15 |
| B | >300 | 151 ± 9 | 68 ± 6 | 93 ± 6 | 2.97/0.003 | 3.10/0.002 | 0.16 |
| C | >300 | 152 ± 9 | 59 ± 2 | 86 ± 4 | 2.95/0.002 | 3.17/0.001 | 0.13 |
| D | >300 | 140 ± 4 | 60 ± 2 | 83 ± 5 | 3.02/0.002 | 3.07/0.003 | 0.42 |
| E | >300 | 160 ± 5 | 58 ± 2 | 88 ± 2 | 2.92/0.002 | 3.03/0.003 | 0.12 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tan$\delta$ the dissipation factor, measured at 1 MHz, 25° C., two-fluid cell.
[f.] Relative humidity.
[g.] Weight gain after two weeks at 50% relative humidity.

TABLE 6

| Sample | Tg(°C.)[a] DSC | Tsp(°C.)[b] TMA | $\alpha_g$[c] (ppm/°C.) | $\alpha_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|---|
| A | >300 | 197 ± 2 | 60 ± 1 | 67 ± 3 | 2.98/0.003 | 3.02/0.007 | 0.16 |
| B | >300 | 171 ± 5 | 52 ± 2 | 65 ± 3 | 2.98/ | 3.02 | 0.18 |

TABLE 6-continued

| Tg(°C.)[a] | Tsp(°C.)[b] | $a_g$[c] | $a_{260}$[d] | $\epsilon'/\tan\delta$[e] | | H2O[g] absorption |
|---|---|---|---|---|---|---|
| DSC | TMA | (ppm/°C.) | (ppm/°C.) | 0% RH[f] | 50% RH | (wt %) |
| | | | | 0.006 | 0.004 | |

[a]. Glass transition temperature.
[b]. Softening point.
[c]. Coefficient of thermal expansion from 25° C. to Tsp.
[d]. Coefficient of thermal expansion from 25° C. to 260° C.
[e]. $\epsilon'$ is the dielectric constant, $\tan\delta$ the dissipation factor, measured at 1 MHz, 25° C., two-fluid cell.
[f]. Relative humidity.
[g]. Weight gain after two weeks at 50% relative humidity.

EXAMPLE VII

Synthesis of Styrene Terminated Tetraphenol Ethane (70% Vinylbenzyl/30% Benzyl) (STTPE (70 VBz/30 Bz)).

To a 2 L, 3 neck round bottom flask equipped with a stirring shaft, an addition funnel and a condenser was added 100.0 g tetraphenol ethane (TPE) (Mn=274, Mw=711) (0.142 mol), 0.94 g BHT (0.00425 mol) and 475 ml N-methyl pyrrolidinone (NMP). Upon dissolution of the TPE, 99.06 g vinylbenzyl chloride (VBC) (0.649 mol) were added and the vessel flushed and placed under positive nitrogen pressure by means of a mineral oil bubbler. The solution was heated to 60° C. by a water bath and 42.45 g KOH (0.662 mol) dissolved in 95 ml of methanol were added dropwise over 30 minutes. The mixture was kept at 60° C. for an additional 3.5 hours. 34.0 ml benzyl chloride (0.297 mol) were then added. 18.20 g KOH (0.283 mol) dissolved in 40 ml methanol were then added dropwise over 30 minutes and the temperature maintained at 60° C. an additional 1.5 hours.

The mixture was cooled and 700 ml toluene were added. The mixture was washed with 2×1.8 L water and 2×1.8 L 1M NaCl (aq). The organic phase was dried over sodium sulfate and filtered through Celite. Solvent was removed by rotary evaporation up to 40° C. at 3 torr leaving a viscous brown resin, 102% yield. GPC analysis found Mn=678, Mw=1020, dispersity 1.51; Infrared analysis indicates no residual hydroxyl (<0.5%); Ion Chromatography found; 16 ppm Cl−, <1 ppm Br−, 5 ppm $SO_4^{-2}$. STTPE (70 VBZ/30 Bz) was cast and cured according to curing procedure hereinbefore set forth in the above examples. Samples are identified as follows.
A: Cast from acetone
B: Cast neat without solvent.

EXAMPLE VIII

Synthesis of Styrene Terminated Tetraphenol Ethane (50% Vinylbenzyl/50% Propyl) (STTPE (50 VBz/50 Pr)).

To a 2 L, 3 neck round bottom flask equipped with a stirring shaft, an addition funnel and a condenser was added 100.0 g tetraphenol ethane (TPE) (Mn=274, Mw=711) (0.142 mol), 0.94 g BHT (0.00425 mol) and 475 ml N-methyl pyrrolidinone (NMP). Upon dissolution of the TPE, 70.58 g vinylbenzyl chloride (VBC) (0.462 mol) were added and the vessel flushed and placed under positive nitrogen pressure by means of a mineral oil bubbler. The solution was heated to 60° C. by a water bath and 30.22 g KOH (0.471 mol) dissolved in 70 ml of methanol were added dropwise over 30 minutes. The mixture was kept at 60° C. for an additional 2.5 hours. 50.4 ml 1-bromopropane (0.555 mol) were then added. 30.22 g KOH (0.471 mol) dissolved in 70 ml methanol were then added dropwise over 30 minutes and the temperature maintained at 60° C. an additional 3 hours.

The mixture was cooled and 700 ml dichloromethane added. The mixture was washed with 2×1.75 L water and 2×1.75 L 1M NaCl (aq). The organic phase was dried over sodium sulfate and filtered through Celite. Solvent was removed by rotary evaporation up to 40° C. at 3 torr leaving an extremely viscous brown resin, 96% yield. GPC analysis found Mn=642, Mw=921, dispersity 1.44; Infrared analysis indicates no residual hydroxyl (<0.5%); Ion Chromatography analysis found: 4 ppm Cl−, <25 ppm Br−, <25 ppm $SO_4^{-2}$. STPPE (50 VBz/50 Pr) was cast and cured according to curing procedure hereinbefore set forth in the above examples. Samples are identified as follows:
A: Cast from acetone
B: Cast neat without solvent

TABLE 7

| | Tg(°C.)[a] | Tsp(°C.)[b] | $a_g$[c] | $a_{260}$[d] | $\epsilon'/\tan\delta$[e] | | H2O[g] absorption |
|---|---|---|---|---|---|---|---|
| | DSC | TMA | (ppm/°C.) | (ppm/°C.) | 0% RH[f] | 50% RH | (wt %) |
| Sample | | | | | | | |
| A | >300 | 171 ± 2 | 49 ± 3 | 66 ± 1 | 2.94/0.036 | 3.14/0.009 | 0.14 |
| B | >300 | 128 ± 6 | 66 ± 10 | 89 ± 4 | 3.00/0.059 | 3.04/0.006 | 0.13 |

[a]. Glass transition temperature.
[b]. Softening point.
[c]. Coefficient of thermal expansion from 25° C. to Tsp.
[d]. Coefficient of thermal expansion from 25° C. to 260° C.
[e]. $\epsilon'$ is the dielectric constant, $\tan\delta$ the dissipation factor, measured at 1 MHz, 25° C., two-fluid cell.
[f]. Relative humidity.
[g]. Weight gain after two weeks at 50% relative humidity.

TABLE 8

| Sample | Tg(°C.)[a] DSC | Tsp(°C.)[b] TMA | $\alpha_g$[c] (ppm/°C.) | $\alpha_{260}$[d] (ppm/°C.) | $\epsilon'/\tan\delta$[e] 0% RH[f] | $\epsilon'/\tan\delta$[e] 50% RH | H2O[g] absorption (wt %) |
|---|---|---|---|---|---|---|---|
| A | >300 | 140 ± 4 | 75 ± 3 | 103 ± 3 | 3.03/ 0.006 | 3.08/ 0.008 | 0.10 |
| B | >300 | 115 ± 9 | 81 ± 7 | 118 ± 5 | 2.99/ 0.001 | 3.02 0.044 | 0.02 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tanδ the dissipation factor, measured at 1 MHz, 25° C., two-fluid cell.
[f.] Relative humidity.
[g.] Weight gain after two weeks at 50% relative humidity.

EXAMPLE IX

Synthesis of Styrene Terminated Tetraphenol Ethane (70% Vinylbenzyl/30% Propyl) (STTPE (70 VBz/30 Pr)):

To a 3 L, 3 neck round bottom flask equipped with a stirring shaft, an additional funnel and a condenser was added 353.0 g tetraphenol ethane (TPE) (Mn=274, Mw=711) (0.500 mol), 3.30 g BHT (0.0150 mol) and 1670 ml N-methyl pyrrolidinone (NMP). Upon dissolution of the TPE, 373.89 g vinylbenzyl chloride (VBC) (2.45 mol) were added and the vessel flushed and placed under positive nitrogen pressure by means of a mineral oil bubbler. The solution was heated to 60° C. by a water bath and 160.25 g KOH (2.50 mol) dissolved in 360 ml of methanol were added dropwise over 30 minutes. The mixture was kept at 60° C. for an additional 3.5 hours. 127 ml 1-bromopropane (1.40 mol) were then added. 68.68 g KOH (1.07 mol) dissolved in 150 ml methanol were then added dropwise over 30 minutes and the temperature maintained at 60° C. an additional 1.5 hours.

The mixture was cooled and 2.5 L dichloromethane were added. The mixture was washed with 3×6.25 L water and 6.25 L 1M NaCl (aq). The organic phase was dried over sodium sulfate and filtered through Celite. Solvent was removed by rotary evaporation up to 40° C. at 3 torr leaving an extremely viscous brown resin, 92% yield. GPC analysis found Mn=696, Mw=1000, dispersity 1.44; Infrared analysis found no residual hydroxyl (<0.5%); Ion Chromatography analysis found: 6 ppm Cl−, <25 ppm Br−, <25 ppm SO4−2. STTPE (70 Bz/30 Pr) was cured according to curing procedure hereinbefore set forth in the above examples. Samples are identified as follows:
A: Cast from acetone
B: Cast from toluene

EXAMPLE X

Synthesis of Styrene Terminated Tetraphenol Ethane (70% Vinylbenzyl/30% Propyl) (STTPE (70 VBz/30 Pr)).

To a 2 L, 3 neck round bottom flask equipped with a stirring shaft, an addition funnel and a condenser was added 200.0 g tetraphenol ethane (TPE) (Mn=274, Mw=711) (0.284 mol), 1.88 g BHT (0.00852 mol) and 950 ml N-methyl pyrrolidinone (NMP). Upon dissolution of the TPE, 212.37 g vinylbenzyl chloride (VBC) (1.39 mol) were added and the vessel flushed and placed under positive nitrogen pressure by means of a mineral oil bubbler. The solution was heated to 60° C. by a water bath and 91.05 g KOH (1.42 mol) dissolved in 200 ml of methanol were added dropwise over 1 hour. The mixture was kept at 60° C. for an additional 3.5 hours. 72 ml 1-bromopropane (0.80 mol) were then added. 38.97 g KOH (0.607 mol) dissolved in 90 ml methanol were then added dropwise over 30 minutes and the temperature maintained at 60° C. an additional 1.5 hours.

The mixture was cooled and 1 L toluene was added. The mixture was washed with 1×2.5 L water and 3×2.5 L 1M NaCl (aq). The organic phase was dried over sodium sulfate, slurried with Celite and filtered. 0.62 g BHT (0.002894 mol) were dissolved in the solution and the solvent was removed by rotary evaporation up to 40° C. at 3 torr leaving an extremely viscous brown resin, 80% yield. GPC analysis found Mn=618, Mw=960, dispersity 1.55; Infrared analysis indicates no residual hydroxyl (<0.5%); Ion Chromatography found: <1 ppm Cl−, 5 ppm Br−, <3 ppm SO4−2. STTPE (70 VBz/30 Pr) was cast neat without solvent and cured according to curing procedure hereinbefore set forth in the above examples. Analysis of the cured polymer disclosed the following properties.

TABLE 9

| Sample | Tg(°C.)[a] DSC | Tsp(°C.)[b] TMA | $\alpha_g$[c] (ppm/°C.) | $\alpha_{260}$[d] (ppm/°C.) | $\epsilon'/\tan\delta$[e] 0% RH[f] | $\epsilon'/\tan\delta$[e] 50% RH | H2O[g] absorption (wt %) |
|---|---|---|---|---|---|---|---|
| A | >300 | 169 ± 7 | 53 ± 2 | 61 ± 2 | 3.01/ 0.0004 | 3.05/ 0.003 | 0.20 |
| B | >300 | 191 ± 4 | 34 ± 3 | 53 ± 2 | 2.95/ 0.002 | 3.00 0.001 | 0.12 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tanδ the dissipation factor, measured at 1 MHz, 25° C., two-fluid cell.
[f.] Relative humidity.
[g.] Weight gain after two weeks at 50% relative humidity.

TABLE 10

| Tg(°C.)[a] DSC | Tsp(°C.)[b] TMA | $\alpha_g$[c] (ppm/°C.) | $\alpha_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|
| >300 | 146 ± 1 | 62 ± 3 | 76 ± 4 | 2.94/ 0.033 | 2.97/ 0.008 | 0.14 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tan$\delta$ the dissipation factor, measured at 1 MHz, 25° C., two-fluid cell.
[f.] Relative humidity.
[g.] Weight gain after two weeks at 50% relative humidity.

EXAMPLE XI

Synthesis of Styrene Terminated Tetraphenol Ethane (70% Vinylbenzyl/30% Propyl) (STTPE (70 VBz/30 Pr)).

To a 3 L, 3 neck round bottom flask equipped with a stirring shaft, an addition funnel and a condenser was added 353.0 g tetraphenol ethane (TPE) (Mn=274, Mw=711) (0.500 mol), 3.30 g BHT (0.0150 mol) and 1670 ml N-methyl pyrrolidinone (NMP). Upon dissolution of the TPE, 373.89 g vinylbenzyl chloride (VBC) (2.45 mol) were added and the vessel flushed and placed under positive nitrogen pressure by means of a mineral oil bubbler. The solution was heated to 60° C. by a water bath and 160.25 g KOH (2.50 mol) dissolved in 360 ml of methanol were added dropwise over 30 minutes. The mixture was kept as 60° C. for an additional 3.5 hours. 127 ml 1-bromopropane (1.40 mol) were then added. 68.68 g KOH (1.07 mol) dissolved in 150 ml methanol were then added dropwise over 30 minutes and the temperature maintained at 60° C. an additional 1.5 hours.

The mixture was cooled and 2 L toluene were added. The mixture was washed with 1×5 L water and 3×5 L 1M NaCl (aq). The organic phase was dried over sodium sulfate and filtered through Celite. 1 mole percent of t-butyl catechol was added as a radical scavenger. Solvent was removed by rotary evaporation up to 40° C. at 3 torr leaving an extremely viscous brown resin, 84% yield. GPC analysis found Mn=576, Mw=915, dispersity 1.59; Infrared analysis found no residual hydroxyl (<0.5%); Ion Chromatography found: 3 ppm Cl−7 ppm Br−, 18 ppm SO4−2. STTPE (70 VBz/30 Pr) was cast neat without solvent and cured according to curing procedure hereinbefore set forth in the above examples. Analysis of the cured polymer disclosed the following properties.

TABLE 11

| Tg(°C.)[a] DSC | Tsp(°C.)[b] TMA | $\alpha_g$[c] (ppm/°C.) | $\alpha_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|
| >300 | 103 ± 11 | 63 ± 4 | 80 ± 1 | 2.97/ 0.001 | 3.02/ 0.001 | 0.24 |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tan$\delta$ the dissipation factor, measured at 1 MHz, 25° C., two-fluid cell.
[f.] Relative humidity.
[g.] Weight gain after two weeks at 50% relative humidity.

EXAMPLE XII

Synthesis of Styrene Terminated Tetraphenol Ethane (100% Vinylbenzyl) (STTPE (100 VBz)).

To a 2 L, 3 neck round bottom flask equipped with a stirring shaft, an addition funnel and a condenser was added 200.0 g tetraphenol ethane (TPE) (Mn=274, Mw=711) (0.284 mol), 188 g BHT (0.00852 mol) and 950 ml N-methyl pyrrolidinone (NMP). Upon dissolution of the TPE, 242.65 g vinylbenzyl chloride (VBC) (1.50 mol) were added and the vessel flushed and placed under positive nitrogen pressure by means of a mineral oil bubbler. The solution was heated to 60° C. by a water bath and 101.95 g KOH (1.59 mol) dissolved in 230 ml of methanol were added dropwise over 30 minutes. The mixture was kept at 60° C. for an additional 4.7 hours. 15.17 g VBC (0.0994 mol) were then added. 6.37 g KOH (0.0994 mol) dissolved in 15 ml methanol were then added dropwise. A final identical addition of VBC and KOH/methanol was made 1.7 hours later and the reaction maintained at 60° C. for 1 hour longer.

The mixture was cooled and 1.2 L toluene were added. The mixture was washed with 1×3 L water and 2×3 L 1M NaCl (aq). The organic phase was dried over sodium sulfate, slurried with Celite and filtered. Solvent was removed by rotary evaporation up to 40° C. at 3 torr leaving a viscous brown resin, 95% yield. GPC analysis found Mn=778, Mw=1079, dispersity 1.39; Infrared analysis indicates no residual hydroxyl (<0.5%); Ion Chromatography found: 45 ppm Cl−. STTPE (100 VBz) was cast neat without solvent and cured according to the curing procedure hereinbefore set forth in the above examples. Analysis of the cured polymer disclosed the following properties.

TABLE 12

| Tg(°C.)[a] DSC | Tsp(°C.)[b] TMA | $\alpha_g$[c] (ppm/°C.) | $\alpha_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|
| >300 | h | h | h | 2.97/ | 3.03/ | 0.236 |

TABLE 12-continued

| Tg(°C.)[a] DSC | Tsp(°C.)[b] TMA | $a_g$[c] (ppm/°C.) | $a_{260}$[d] (ppm/°C.) | $\epsilon'$/tan$\delta$[e] 0% RH[f] | 50% RH | H2O[g] absorption (wt %) |
|---|---|---|---|---|---|---|
| | | | | 0.0004 | 0.003 | |

[a.] Glass transition temperature.
[b.] Softening point.
[c.] Coefficient of thermal expansion from 25° C. to Tsp.
[d.] Coefficient of thermal expansion from 25° C. to 260° C.
[e.] $\epsilon'$ is the dielectric constant, tan$\delta$ the dissipation factor, measured at 1 MHz, 25° C., two-fluid cell.
[f.] Relative humidity.
[g.] Weight gain after two weeks at 50% relative humidity.
[h.] Not determined.

EXAMPLE XIII

Synthesis of Styrene Terminated Tetraphenol Ethane (100% Vinylbenzyl) (STTPE (100 VBz)).

100 grams (0.142 mole) of commercialgrade tetraphenol ethane (TPE) ($M_n$=274, $M_w$=711), and 166.54 grams (1.091 moles) of vinyl benzyl chloride (60/40 meta/para isomer ratio) were dissolved in 250 milliliters of acetone in a 2 liter three neck-round bottom flask which was equipped with condenser, addition funnel, thermometer, mechanical stirrer and nitrogen purge. The reaction mixture was then heated to reflux (65°–70° C.) for a period of one hour, following which a solution of 67.5 g (1.202 moles) of potassium hydroxide in 150 milliliters of methanol was added to the warm reaction mixture over an interval of 30 minutes with continuous stirring. The reaction mixture was maintained at reflux temperature for a period of 1 hour, thereafter diluted with 400 milliliters of acetone and was then stirred at ambient temperature for a period of 24 hours. The reaction mixture was then recovered, dried over magnesium sulfate, filtered and concentrated under vacuum. The oil was then taken up in an equal volume of acetone and precipitated from acetone solution by addition of methanol. The resulting solid was vacuum dried at ambient temperature for a period of 24 hours to yield 87.0 grams of yellow crystalline material having a melting point of 52° C.; a $M_n$ of 1.088K and $M_w$ of 5.080K. The resin was cast from chloroform solution using the curing procedure hereinbefore set forth in the above example. Analysis of the cured polymer disclosed the following properties.

TABLE 13

| Tg(°C.)[a] DSC | Tsp(°C.)[b] TMA | $a_{260}$[c] (ppm/°C.) | $\epsilon'$/tan$\delta$[d] 0% RH[e] |
|---|---|---|---|
| >300 | N.O. | 42 ± 6 | 2.89/0.006 |

[a]Glass transition temperature.
[b]Softening point.
[c]Coefficient of thermal expansion (z-axis) from 25° C. to 260° C.
[d]$\epsilon'$ is the dielectric constant, tan$\delta$ the dissipation factor, measured at 1 MHz, 25° C., parallel plate electrodes.
[e]Relative humidity.
N.O. None observed up to 300° C.

EXAMPLE XIV

Spin Coating and Thermal Curing of STTPE (100 VBz).

A 10 weight percent solution of STTPE (100 VBz) (Example XIII) in DMF was prepared. This solution was spin coated at 3000 rpm for 30 seconds onto a silicon wafer with an aluminum electrode. The tack free coating was cured employing the same curing procedure hereinbefore set forth in the above examples. The adhesion of the polymer film was analyzed via a Scotch Tape Peel Test, the film remained intact with no cohesive failure to either the silicon substrate or aluminum electrode. The solubility of the cured polymer was analyzed by placing the sample in boiling DMF for 5 minutes, the polymer film remained intact.

EXAMPLE XV

Photocuring of STTPE (100 VBz) with 4,4'-bis(dimethylamino) benzophenone.

0.4976 g of STTPE (100 VBz) (Example XIII) and 0.0061 g (1.2 weight percent) of 4,4'-bis(dimethylamino) benzophenone were dissolved in 4.533 g of DMF. This solution was filtered through a 0.45 micron Teflon filter and spin coated onto silicon wafers at 1150 rpm for 10 seconds. The samples were allowed to air dry at 25° C. for 24 hours. The samples were photocured with a UV/Visible Lamp of 200 Watt per Square Inch (WPI) placed 6 inches from sample, for varying periods of time. The photocuring was analyzed by checking the solubility of the cured polymer in DMF.

TABLE 14

| Photo Curing Time (minutes) | Solvent Resistance in DMF |
|---|---|
| 0.5 | some dissolution of film and discoloration of DMF |
| 1.0 | some dissolution of film |
| 2.0 | No dissolution of film, slight discoloration of DMF |
| 5.0 | No dissolution of film, film remains intact |

EXAMPLE XVI

Photocuring of STTPE (100 VBz) with 4,4'-bis(dimethylamino) benzophenone.

0.4711 g of STTPE (100 VBz) (Example XIII) and 0.0248 g (5.3 weight percent) of 4,4'-bis(dimethylamino) benzophenone were dissolved in 4.446 g of DMF. This solution was filtered through a 0.45 micron Teflon filter and spin coated onto silicon wafers at 1150 rpm for 10 seconds. The samples were allowed to air dry for 24 hours. The samples were photocured as in Example XV and analyzed for photocure via DMF solvent resistance.

TABLE 15

| Photo Curing Time (minutes) | Solvent Resistance in DMF |
|---|---|
| 0.50 | Some resistance to dissolution, dissolves completely with time. |
| 1.00 | Dissolution of film, but some slight resistance to dissolution. |
| 2.00 | Shows slight dissolution at edges after 1 hour. |
| 5.00 | No dissolution of film, film remains |

TABLE 15-continued

| Photo Curing Time (minutes) | Solvent Resistance in DMF |
|---|---|
| | intact after 1 hour. |

EXAMPLE XVII

Spin Coating and Thermal Curing of STTPE (100 VBz).

0.5733 g of STTPE (100 VBz) (Example XIII) and 0.0057 g of 4,4'-bis(dimethylamino) benzophenone were dissolved in 5.212 g of DMF. This solution was filtered through a 0.45 micron Teflon filter and spin coated onto silicon wafers which are partially coated with a copper film, for varying spin coating speeds, spin coating times and applications of coatings. The samples were allowed to air dry for approximately 10 minutes between consecutive applications of coatings and finally air dried at 25° C. for 24 hours. The samples were thermally cured at 200° C. for 2 hours. The film thickness for these samples were measured with a Talysurf 10 Profilometer. These results are summarized below.

TABLE 16

| Sample | Spin Coating Rate (RPM) | Spin Coating Time (seconds) | #Coating Applications | Film Thickness (microns) |
|---|---|---|---|---|
| 1 | 1100 | 10 | 2 | 5.6 |
| 2 | 500 | 20 | 3 | 5.6 |
| 3 | 750 | 15 | 2 | 7.0 |
| 4 | 400 | 20 | 4 | 4.2 |

EXAMPLE XVIII

Photocuring of STTPE (100 VBz)

0.4982 g of STTPE (100 VBz) (Example XIII) was dissolved in b 4.4831 g of DMF. This solution was filtered through a 0.45 micron Teflon filter and spin coated onto silicon wafers at 1150 rpm for 10 seconds. The samples were allowed to dry in a vacuum oven at 25° C. for 24 hours. The samples were photocured as in Example XV and analyzed for photocure via DMF solvent resistance.

TABLE 17

| Photo Curing Time (minutes) | Solvent Resistance in DMF |
|---|---|
| 0.50 | Some resistance to dissolution, dissolves completely with time. |
| 1.00 | Some resistance to dissolution, dissolves with time. |
| 2.00 | Very resistant to dissolution, some dissolution occurs with time. |
| 5.00 | Very resistant to dissolution, slight discoloration of DMF occurs with time. |

EXAMPLE XIX

Photodefined Films of STTPE (70 VBz/30 Pr).

Figure 2:
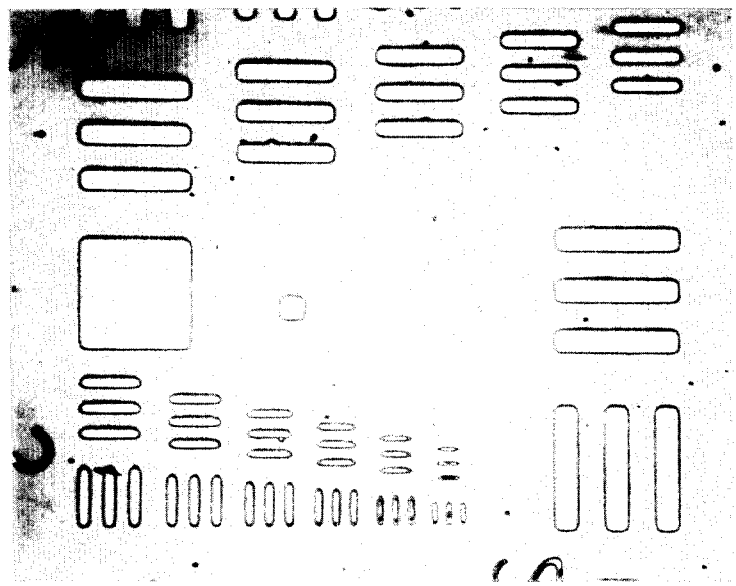
Figure 3:
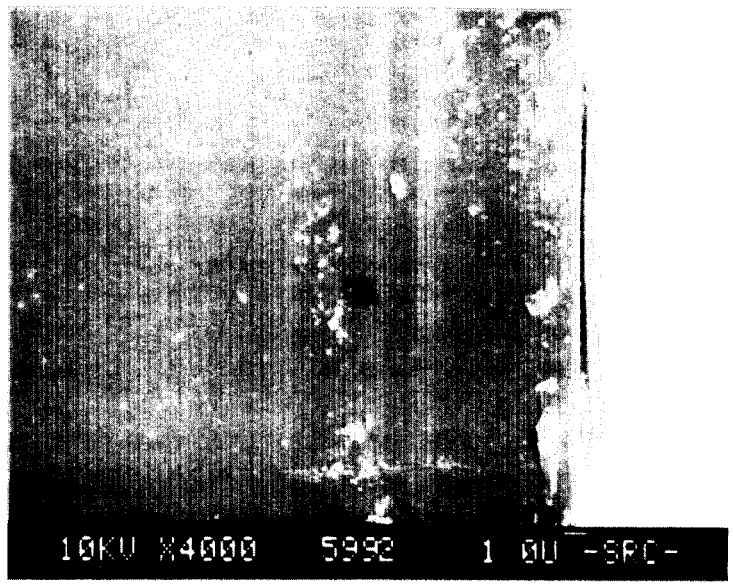
Figure 4:
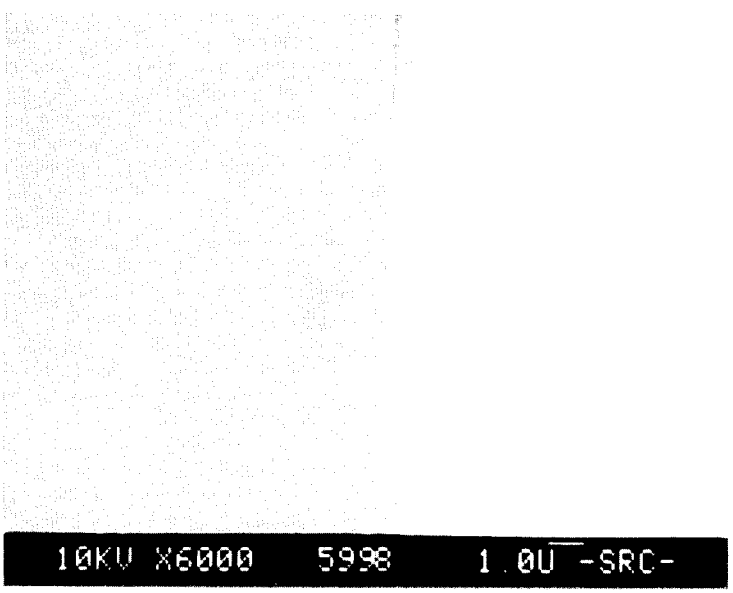
Figure 5:

3.8270 g of STTPE (70 VBz/30 Pr) (Example XI) was dissolved in 8.8206 g of toluene. This solution was filtered through a 0.45 micron Teflon filter and spin coated onto silicon wafers at 1150 rpm for 15 seconds. The samples were softbaked at 25° C. in a vacuum oven for 24 hours. The samples were photocured with a UV/Visible Lamp of 200 WPI placed 1 inch from the sample and employing a glass water cooled filter and a USAF Photo Resist Pattern with an exposure time of 1.5 minutes. The photocured pattern was developed by dissolution of the uncured polymer with toluene for 1.0 minutes. The pattern was fixed by a thermal cure at 275° C. for 1 hour. The results of these experiments indicate a photodefined pattern with a film thickness of approximately 1 micron and resolution capabilities on the order of microns, FIGS. 1 to 5.

EXAMPLE XX

Photodefined Films of STTPE (70 VBz/30 Pr).

Figure 6:
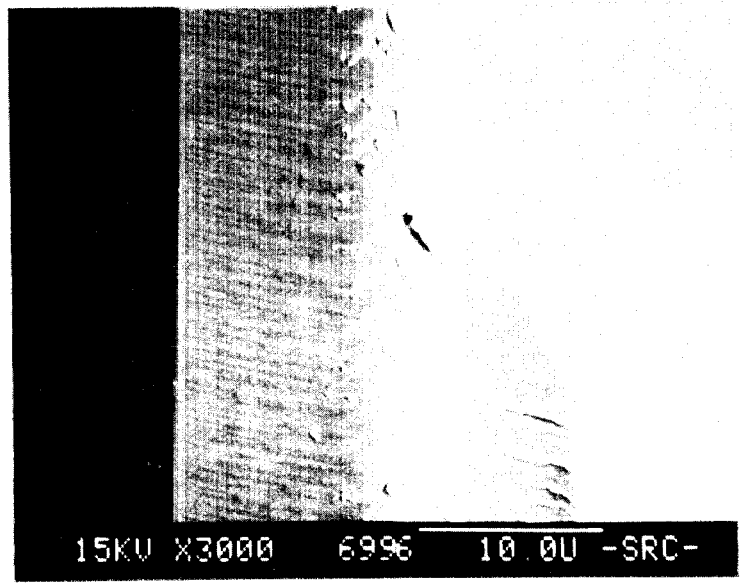
FIGS. 6–10 are photomicrographs of similar films cured at 200° C.
Figure 7:
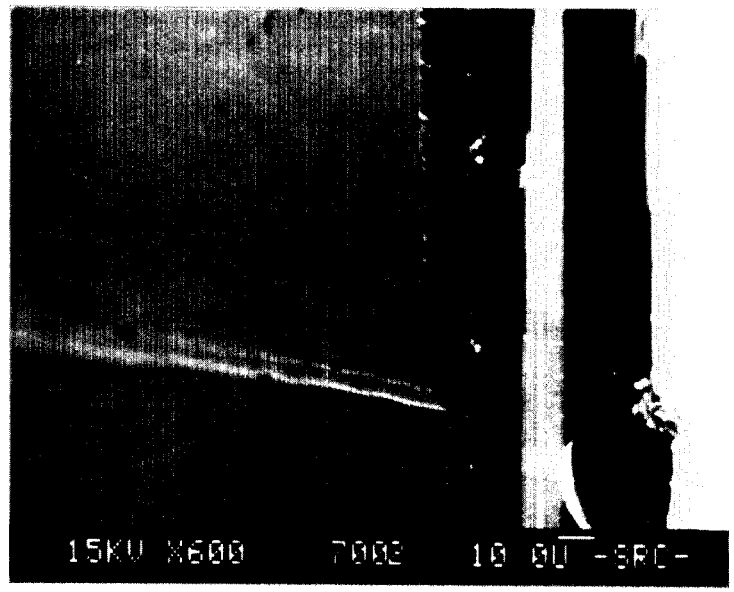
Figure 8:
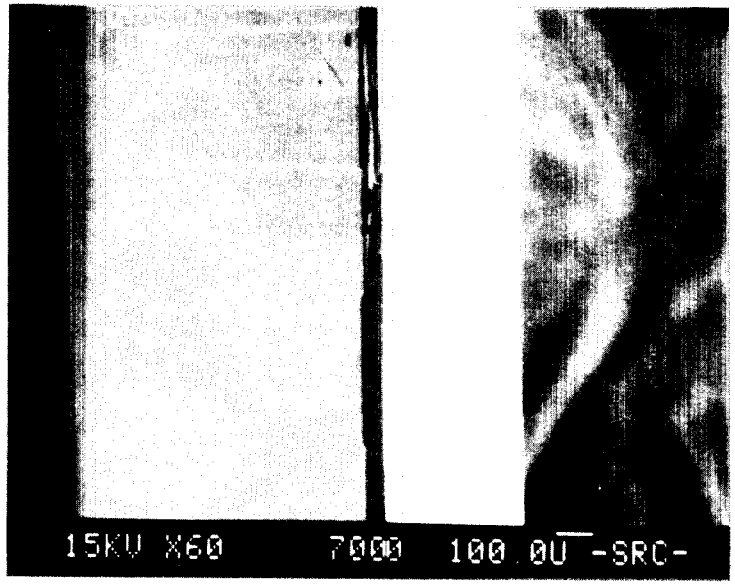
Figure 9:
Figure 10:
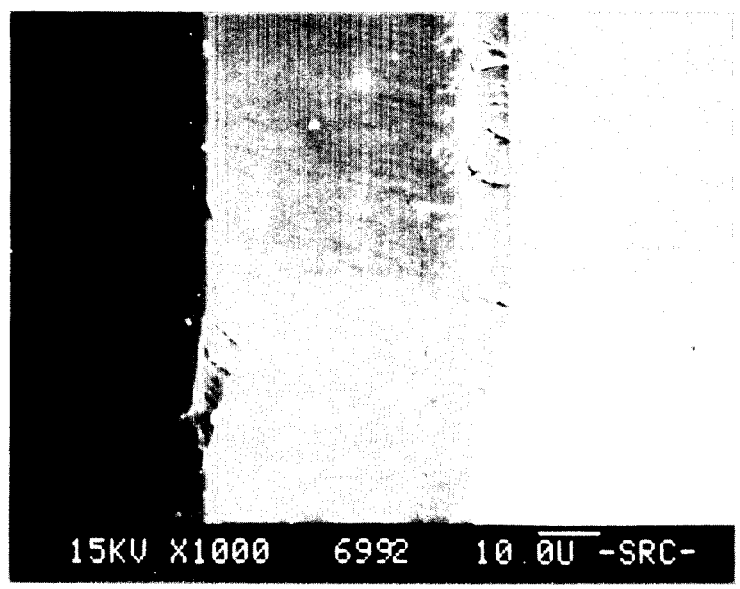

15.3186 g of STTPE (70 VBz/30 Pr) (Example XI) was dissolved in 15.5876 g of toluene. This solution was filtered through a 0.45 micron Teflon filter and spin coated onto silicon wafers at 980 rpm for 15 seconds. The samples were softbaked at 25° C. in a vacuum oven for 24 hours. The samples were photocured with a UV/Visible Lamp of 200 WPI placed 1 inch from the sample and employing a quartz water cooled filter and an IPC B-25 Photo Resist Pattern with an exposure time of 3.0 minutes. The photocured pattern was developed by dissolution of the uncured polymer with toluene for 1.0 minutes. The pattern was fixed by a thermal cure at 200° C. for 4 hours. The results of these experiments indicate a photodefined pattern with a film thickness of approximately 7 to 10 microns, FIGS. 6 to 10.

What is claimed is:

1. A method of selectively forming a patterned polymeric resin on a substrate comprising:
    (a) coating a substrate with a prepolymer which is an oligomeric resin comprising ethers of the oligomeric condensation product of 1 molar proportion of a dialdehyde, with a dialdehyde selected from the group consisting of OHC(CH2)nCHO, where n=0 or an integer from 1 to 6, cyclopentanedione, cyclohexanedione, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde, with from about 3 to about 4 molar proportions of a phenol of structure $R_1C_6H_4OH$ where $R_1$ is hydrogen or an alkyl group containing from 1 to about 10 carbon atoms, and where the ether moiety is randomly selected from the group consisting of vinylbenzyl, alkyl moieties containing from 1 to 10 carbon atoms, cycloalkyl moieties of 5 to 10 carbon atoms, and benzyl, with the ratio of vinylbenzyl to other moieties being from 1:1 to about 6:1;
    (b) irradiating the prepolymer coating through a masking pattern so as to selectively crosslink portions of the coating being irradiated;
    (c) selectively dissolving the non-irradiated parts of the prepolymer coating; and
    (d) curing the patterned photochemically crosslinked portion of the prepolymer coating by heating said portion at a temperature greater than about 110° C. for a time sufficient to further crosslink said coating and transform the prepolymer to an infusible glassy solid.

2. The method of claim 1 where the dialdehyde is OHC(CH$_2$)$_n$CHO and n is 0 or an integer from 1 to 4.

3. The method of claim 2 where n is zero.

4. The method of claim 1 where the phenol is phenol.

5. The method of claim 1 where the phenol is cresol.

6. The method of claim 1 where each oligomeric condensation product has from about 4 to about 60 phenol moieties per molecule.

7. The method of claim 6 where the condensation product has from about 4 to about 22 phenolic moieties per molecule.

8. The method of claim 7 further characterized in that the mixture of oligomeric condensation products has an average from about 5 to about 8 phenolic moieties per molecule.

9. The method of claim 4 where the dialdehyde is glyoxal and further characterized in that the molecular weight of each oligomeric condensation product is from about 400 to about 6,000.

10. The method of claim 9 where the molecular weight of each oligomeric condensation product is from about 400 to about 2200.

11. The method of claim 9 further characterized in that the average molecular weight of the mixture of oligomeric condensation products is from about 500 to about 800.

12. The resin of claim 1 where the other ether moieties are selected from the group consisting of alkyl moieties having 1 through about 4 carbon atoms.

13. The method of claim 1 where the alkyl moiety is a primary alkyl moiety.

14. The method of claim 1 where irradiation is performed by x-ray, electron beam, ion beam, ultraviolet, or visible radiation.

15. The method of claim 1 where the radiation has a wave length between bout 200 and about 800 nanometers.

16. The method of claim 1 where the non-irradiated prepolymer coating is selectively dissolved using solvent selected from the group consisting of aprotic solvents, aromatic hydrocarbons, chlorinated hydrocarbons, esters, ketones, and Carbitols.

17. The method of claim 1 further characterized in that the prepolymer coating contains a photosensitizer in an amount from about 0.001 to about 5.0 weight percent, based on the resin.

* * * * *

UNITED STATES PATENT AND TRADEMARK OFFICE
CERTIFICATE OF CORRECTION

PATENT NO. : 4,908,096
DATED : March 13, 1990
INVENTOR(S) : Joseph J. Zupancic

It is certified that error appears in the above-identified patent and that said Letters Patent is hereby corrected as shown below:

Column 3, line 14: after "polymer" insert --composition--
Column 3, line 49: "2microns" should read --2 microns--
Column 4, line 14: "selfadhesion" should read --self-adhesion--
Column 4, line 17: "converted" should read --conventional--
Column 4, line 31: "noncrosslinked" should read --non-crosslinked--
Column 8, line 12: "paraisomers" should read --para-isomers--
Column 8, line 61: "preferably" should read --preferable--
Column 9, line 4: "successively" should read --successfully--
Column 10, line 47: "pressure be means" should read --pressure by means--
Column 11, line 67: "dichloromethane an washed" should read --dichloromethane and washed--
Column 12, line 49: after "0.94" insert --g--

UNITED STATES PATENT AND TRADEMARK OFFICE
CERTIFICATE OF CORRECTION

PATENT NO. : 4,908,096  Page 2 of 2

DATED : March 13, 1990

INVENTOR(S) : Joseph J. Zupancic

It is certified that error appears in the above-identified patent and that said Letters Patent is hereby corrected as shown below:

Column 13, line 23:   "a-Glass temperature" should read --a-Glass transition temperature--

Column 14, line 9:   "Cl$^{31}$" should read --Cl$^-$--

Column 14, line 65:   "0.742 m mol" should read --0.742 mol--

Column 16, line 19:   "in 56 ml" should read --in 65 ml--

Column 19, line 23:   "additional" should read --addition--

Column 22, line 39:   "(1.50 mol)" should read (1.59 mol)

Column 23, line 17:   "commercialgrade" should read --commercial grade--

Column 25, line 37:   "dissolved in b 4.4831 g" should read --dissolved in 4.4831 g--

Column 26, line 42:   "OHC(CH2)nCHO)" should read --OHC(CH$_2$)$_n$CHO--

Column 28, line 13:   "bout" should read --about--

Signed and Sealed this

Twenty-third Day of March, 1993

Attest:

STEPHEN G. KUNIN

*Attesting Officer*   Acting Commissioner of Patents and Trademarks